United States Patent
Kohno et al.

(10) Patent No.: US 9,396,904 B2
(45) Date of Patent: Jul. 19, 2016

(54) MULTIPOLE LENS, METHOD OF FABRICATING SAME, AND CHARGED PARTICLE BEAM SYSTEM

(71) Applicant: JEOL Ltd., Tokyo (JP)

(72) Inventors: Yuji Kohno, Tokyo (JP); Norikazu Arima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/619,381

(22) Filed: Feb. 11, 2015

(65) Prior Publication Data
US 2015/0287566 A1     Oct. 8, 2015

(30) Foreign Application Priority Data
Feb. 13, 2014   (JP) .................................. 2014-25291

(51) Int. Cl.
*H01J 37/141*    (2006.01)

(52) U.S. Cl.
CPC ....... *H01J 37/141* (2013.01); *H01J 2237/1415* (2013.01); *Y10T 29/4902* (2015.01); *Y10T 29/49826* (2015.01)

(58) Field of Classification Search
CPC ....... H01J 37/10; H01J 37/14; H01J 37/1413; H01J 37/1416; H01J 37/143; H01J 37/145; H01J 2237/14; H01J 2237/1405; H01J 2237/141; H01J 2237/1415

USPC .................................... 250/396 R–396 ML
See application file for complete search history.

(56) References Cited

U.S. PATENT DOCUMENTS

| 2,910,603 | A | * | 10/1959 | Dorsten | H01J 37/141 250/396 R |
| 4,629,899 | A | * | 12/1986 | Plies | G21K 1/08 250/251 |
| 5,838,011 | A | * | 11/1998 | Krijn | H01J 37/153 250/396 R |
| 2004/0251423 | A1 | * | 12/2004 | Kawai | H01J 9/236 250/396 R |
| 2005/0029466 | A1 | * | 2/2005 | Kawai | H01J 9/18 250/396 R |
| 2010/0127188 | A1 | * | 5/2010 | Nutt | G21G 1/001 250/491.1 |

FOREIGN PATENT DOCUMENTS

JP     2007287365 A     11/2007

* cited by examiner

*Primary Examiner* — Jack Berman
*Assistant Examiner* — David E Smith
(74) *Attorney, Agent, or Firm* — The Webb Law Firm

(57) ABSTRACT

There is disclosed a method of fabricating a smaller-sized multipole lens having polar elements that can be formed with high accuracy. The method starts with forming a first member (10) having a first yoke (14) formed integrally with first polar elements (12). A second member (20) having a second yoke (24) formed integrally with second polar elements (22) is formed. The first yoke (14) is made to overlap with the second yoke (24). The first member (10) and the second member (20) are held.

13 Claims, 10 Drawing Sheets

MULTIPOLE LENS, METHOD OF FABRICATING SAME, AND CHARGED PARTICLE BEAM SYSTEM

BACKGROUND OF THE INVENTION

1. Field of the Invention

The present invention relates to a multipole lens, method of fabricating it, and charged particle beam system.

2. Description of Related Art

It is known that there are charged particle beam systems (such as transmission electron microscopes, scanning electron microscopes, and other instruments) having built-in aberration correctors for correcting aberrations (such as spherical aberration and chromatic aberration) in lenses. In such a spherical aberration corrector, aberration correction is implemented by applying a magnetic or electric field to a path for a charged particle beam (such as an electron beam) by the use of a multipole lens having a plurality of polar elements which need to be positioned with high positional accuracy.

In order to improve the positional accuracy of the multipole lens, it is desired to fabricate each individual polar element in one machining operation. For example, JP-A-2007-287365 sets forth a technique of improving the positional accuracy of a field produced by multiple polar elements by machining the front ends of the polar elements and multipole lens assembly references in one operation so as to minimize the positional deviations of the front ends of the polar elements from the assembly references.

In a charged particle beam system, in order to install such a multipole lens in a narrow space, it is necessary to reduce the parts count of the multipole lens assembly or to reduce the sizes of the parts. When the parts are reduced in size, the parts need to have simple shapes to provide high accuracy.

With the technique set forth in JP-A-2007-287365, however, one multipole lens is divided into a required number of parts. For example, where the multipole lens has 12 poles, the lens is divided into 12 parts. Mechanical components for securing these parts are also needed. This leads to an increase in parts count, in which case it is difficult to miniaturize the lens. Furthermore, where a multipole lens is fabricated from separate parts, it is difficult to position the polar elements with high accuracy.

SUMMARY OF THE INVENTION

In view of the foregoing problems, the present invention has been made. One object associated with some aspects of the present invention is to provide a multipole lens which is small in size and has poles arranged at high accuracy. It is another object to provide a method of fabricating this multipole lens. One object associated with some aspects of the invention is to provide a charged particle beam system including this multipole lens.

(1) A method of fabricating a multipole lens in accordance with the present invention starts with forming a first member having a first yoke formed integrally with at least one first polar element. Then, a second member having a second yoke formed integrally with at least one second polar element is formed. The first yoke is made to overlap with the second yoke, and the first and second members are held.

In this method of fabricating a multipole lens, the first polar element and the first yoke are formed integrally and so a parts count reduction can be achieved compared with the case where polar elements and a yoke are fabricated separately. Furthermore, the positional accuracy of the first polar element can be enhanced. In addition, the second polar element and the second yoke are formed integrally. This similarly leads to a decrease in parts count and an improvement of the positional accuracy of the second polar element. Accordingly, this method of fabricating a multipole lens permits fabrication of polar elements with high accuracy while allowing for miniaturization of the lens. In addition, the parts count can be reduced. Consequently, it is easy to fabricate this multipole lens.

According to this method of fabricating a multipole lens, the spacings between successively adjacent ones of the polar elements in the first and second members can be made greater than where all polar elements are formed in one yoke. Therefore, if the multipole lens is reduced in size, it is unlikely that coils cannot be inserted or can be inserted but with difficulty between successively adjacent ones of the polar elements. Consequently, this method allows for miniaturization of the multipole lens. Additionally, a multipole lens to which a strong magnetic field can be applied can be achieved, for example, by reducing the diameters of front end portions of the polar elements.

(2) In one feature of this method of fabricating a multipole lens, the first polar element and the second polar element are equal in height. The height of each of the first and second polar elements may be set equal to a sum of a height of the first yoke and a height of the second yoke.

With this method of fabricating a multipole lens, both end surfaces of the multipole lens can be flattened.

(3) In another feature of this method, the first and second polar elements may have their respective top surfaces located within the same plane. The first and second polar elements may have their respective bottom surfaces located within the same plane.

With this method of fabricating a multipole lens, both end surfaces of the multipole lens can be flattened.

(4) In a further feature of this method, the first and second yokes may be hollow and cylindrically shaped. The first and second polar elements may be located inside the first and second yokes, respectively.

With this method of fabricating a multipole lens, the positional accuracy of the polar elements can be enhanced easily by assembling the lens based on the outer peripheries of the first and second yokes. Furthermore, where the first yoke and the second yoke are placed on top of each other, the polar elements can move only in the direction of rotation. Hence, it is easy to place the polar elements in position in the direction of rotation accurately.

(5) In a yet other feature of this method, the at least one first polar element may be plural in number, and the at least one second polar element may be plural in number.

According to this method of fabricating a multipole lens, even if plural polar elements are formed, the spacings between successively adjacent ones of the polar elements can be set large during manufacturing and so miniaturization of the multipole lens can be achieved.

(6) In a still feature of this method, the first and second members may be shaped substantially identically to each other.

According to this method of fabricating a multipole lens, the lens can be fabricated easily.

(7) In an additional feature of this method, at least one first coil may be mounted on the at least one first polar element prior to the step of holding the first and second members. At least one second coil may be mounted on the at least one second polar element prior to the step of holding the first and second members.

According to this method of fabricating a multipole lens, in a case where the first coils are mounted on the first polar elements, the spacings between successively adjacent ones of the first polar elements can be made larger than where all of polar elements are integrally formed in one yoke. The same principle applies to a case where the second coils are mounted on the second polar elements. Accordingly, if the multipole lens is reduced in size, it is unlikely that coils cannot be inserted or can be inserted but with difficulty between successively adjacent ones of the polar elements. Therefore, this method allows for miniaturization of the multipole lens. Further, a multipole lens to which a strong magnetic field can be applied can be accomplished by reducing the diameters of the front end portions of the polar elements.

(8) In a still other feature of this method, the first yoke may be made to overlap with the second yoke and the first and second polar elements may be made uniform in height prior to the step of holding the first and second members.

According to this method of fabricating a multipole lens, the first and second polar elements can be made uniform in height easily and accurately.

(9) In a yet further feature of this method, the first yoke may be made to overlap with the second yoke and the first and second polar elements may be machined prior to the step of holding the first and second members.

In this method of fabricating a multipole lens, the polar elements can be formed with high accuracy by making the first yoke overlap with the second yoke and machining the polar elements while treating the first and second members as one unitary member.

(10) A multipole lens associated with the present invention has a first member and a second member. The first member has a first yoke formed integrally with at least one first polar element. The second member has a second yoke formed integrally with at least one second polar element. The first yoke overlaps with the second yoke.

This multipole lens can be made smaller in size.

(11) In one feature of this multipole lens, the first polar element and the second polar element may be equal in height. The height of each of the first and second polar elements may be set equal to a sum of a height of the first yoke and a height of the second yoke.

(12) In another feature of this multipole lens, the first and second polar elements may have their respective top surfaces located within the same plane. The first and second polar elements may have their respective bottom surfaces located within the same plane.

(13) In a further feature of this multipole lens, the first and second yokes may be hollow and cylindrically shaped. The first and second polar elements may be located inside the first and second yokes, respectively.

(14) In an additional feature of this multipole lens, the at least one first polar element may be plural in number, and the at least one second polar element may be plural in number.

(15) A charged particle beam system associated with the present invention includes a multipole lens associated with the present invention.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Multipole Lens

Figure 1:
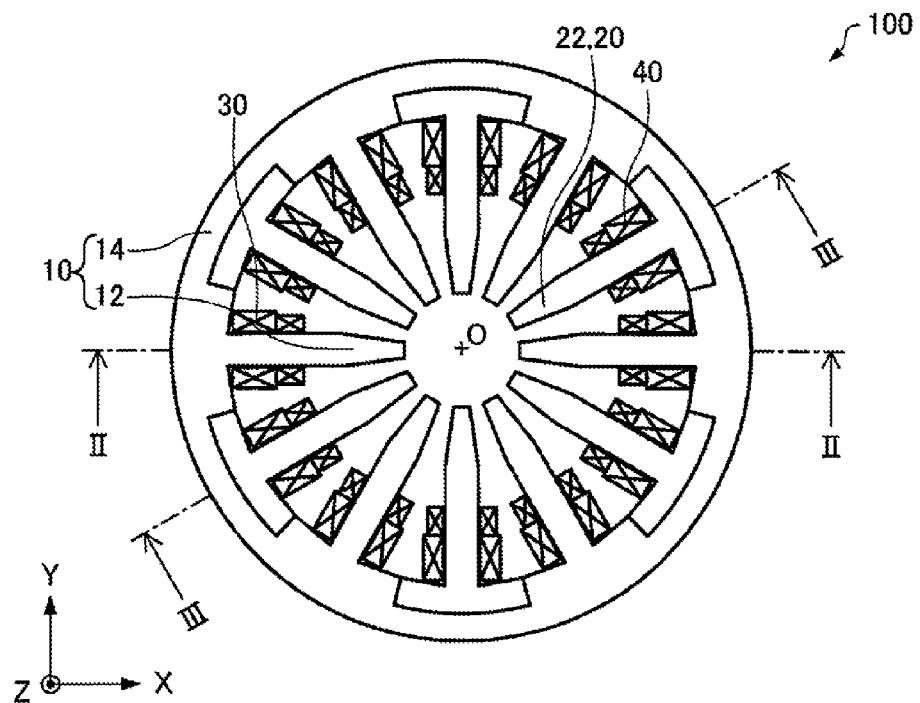
FIG. 1 is a schematic plan view of a multipole lens associated with one embodiment of the present invention.
Figure 2:
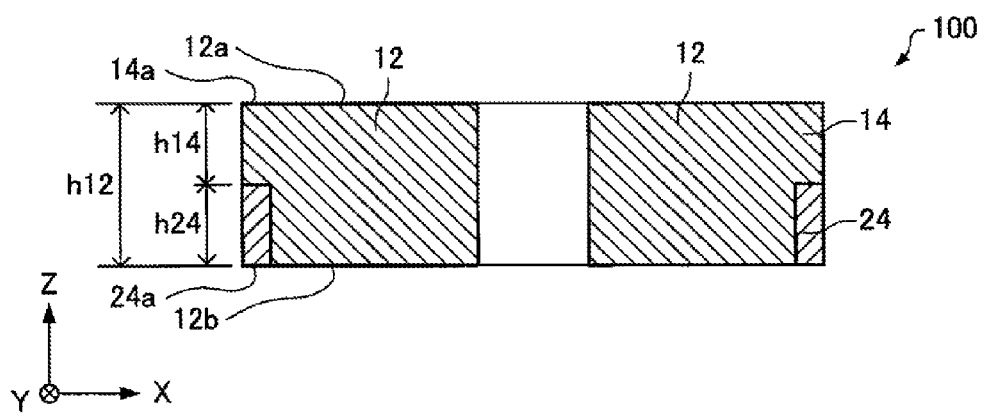
FIG. 2 is a cross-sectional view taken on line II-II of FIG. 1.
Figure 3:
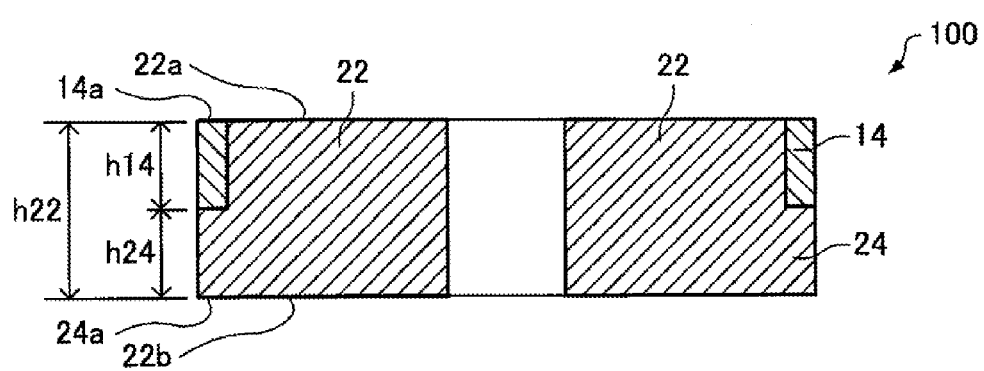
FIG. 3 is a cross-sectional view taken on line of FIG. 1.
Figure 4:
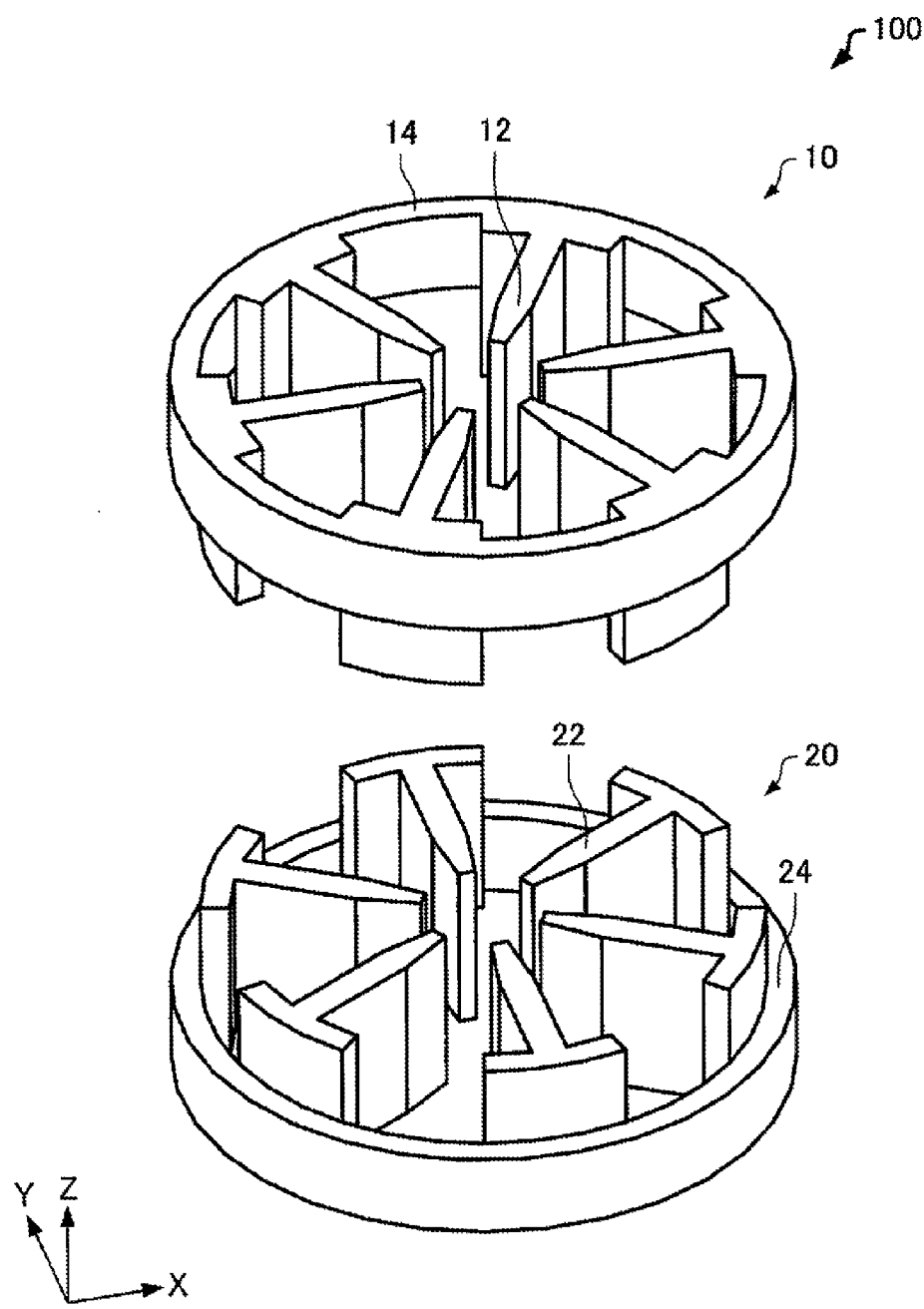
FIG. 4 is a schematic exploded perspective view of the multipole lens shown in FIG. 1.

A multipole lens associated with one embodiment of the present invention is first described by referring to FIGS. 1-4. FIG. 1 is a schematic plan view of the multipole lens, generally indicated by reference numeral 100. FIG. 2 is a schematic cross-sectional view of the multipole lens 100, taken on line II-II of FIG. 1. FIG. 3 is a schematic cross-sectional view of the multipole lens 100, taken on line of FIG. 1. FIG. 4 is a schematic exploded perspective view of the multipole lens 100. In FIGS. 1, 2, and 4, X-, Y-, and Z-axes are shown as mutually perpendicular axes.

As shown in FIGS. 1-4, the multipole lens 100 includes a first member 10, a second member 20, and coils 30, 40. For the sake of convenience, the coils 30 and 40 are omitted from being shown in FIGS. 2-4. It is assumed here that the multipole lens 100 has 12 poles.

The first member 10 includes at least one (typically, a plurality of) first polar element(s) 12 and a first yoke 14.

The first polar elements 12 are formed integrally with the first yoke 14. That is, the first polar elements 12 and the first yoke 14 are not coupled together by connecting members (such as screws or adhesive) or by welding. The first polar elements 12 are located inside the first yoke 14 that is hollow and cylindrically shaped. The first polar elements 12 extend from the first yoke 14 toward the center O of the multipole lens 100 within a plane as viewed from the direction of the Z-axis. In other words, the first polar elements 12 extend radially of a circle centered at the center O.

The at least one first polar element 12 is plural in number (6 in the illustrated example). In the first member 10, the plural first polar elements 12 are arranged radially about the center O as viewed within a plane. In the first member 10, the first polar elements 12 are arranged at regular intervals. That is, the distances (e.g., the shortest distances) between successively adjacent ones of the first polar elements 12 are equal. In the space between any two adjacent first polar elements 12, the distance between the front ends of the first polar elements 12 which are closer to the center O is smaller than the distance between the bases of the first polar elements 12 which are closer to the first yoke 14.

The first yoke 14 is hollow and cylindrically shaped. The first polar elements 12 are formed on the inner surface of the first yoke 14. The first yoke 14 has a height of h14, taken in the direction of the Z-axis. In the example shown in FIG. 2, the height h14 of the first yoke 14 is one-half of the height, h12, of each first polar element 12. The first yoke 14 forms a magnetic path for magnetic flux generated by the coils 30 and 40.

The second member 20 includes at least one (typically, a plurality of) second polar element(s) 22 and a second yoke 24.

The second polar elements 22 are formed integrally with the second yoke 24. That is, the second polar elements 22 and the second yoke 24 are not coupled together by connecting members (such as screws or adhesive) or by welding. The second polar elements 22 are located inside the second yoke 24 that is hollow and cylindrically shaped. The second polar elements 22 extend toward the center O from the second yoke 24 as viewed within a plane. In other words, the second polar elements 22 extend radially of a circle centered at the center O.

The at least one second polar element 22 is plural in number (6 in the illustrated example). In the second member 20, the second polar elements 22 are arranged radially about the center O as viewed within a plane. In the second member 20, the second polar elements 22 are arranged at regular intervals. That is, the distances (e.g., the shortest distances) between successively adjacent ones of the second polar elements 22 are equal. In the space between any two adjacent second polar elements 22, the distance between the front ends of the second polar elements 22 closer to the center O is smaller than the distance between the bases of the second polar elements 22 closer to the second yoke 24. As an example, the second member 20 is identical in shape and size to the first member 10.

The second yoke 24 is hollow and cylindrically shaped. The second polar elements 22 are mounted on the inner surface of the second yoke 24. The second yoke 24 has a height of h24. In the example shown in FIG. 2, the height h24 of the second yoke 24 is one-half of the height, h22, of the second polar elements 22. The second yoke 24 forms a magnetic path for magnetic flux generated by the coils 30 and 40.

No restrictions are imposed on the material of the first member 10 and the material of the second member 20 as long as the materials are magnetic substances.

In the multipole lens 100, the first yoke 14 overlaps with the second yoke 24 in the direction of the Z-axis. In particular, a part of the bottom surface of the first yoke 14 on the −Z-axis side and the top surface of the second yoke 24 on the +Z-axis side are in contact with each other. Consequently, each of the first yoke 14 and second yoke 24 forms a cylindrical member that is identical in height to the polar elements 12 and 22. The first polar elements 12 and the second polar elements 22 are disposed inside these cylindrical members.

In the multipole lens 100, the 6 first polar elements 12 of the first member 10 and the 6 second polar elements 22 of the second member 20 together form 12 poles. The first polar elements 12 and the second polar elements 22 are alternately arranged along a virtual circle (not shown) centered at the center O. The first polar elements 12 and the second polar elements 22 are equally spaced from each other. That is, the distances (shortest distances) between successively adjacent ones of the first polar elements 12 and second polar elements 22 are all equal. The distance between the front end of each first polar element 12 and the center O and the distance between the front end of each second polar element 22 and the center O are equal as viewed within a plane. That is, the front ends of the first polar elements 12 and the front ends of the second polar elements 22 are located on a virtual circle (not shown) centered at the center O.

Each of the first polar elements 12 has the height of h12. Each of the second polar elements 22 has the height of h22. These heights h12 and h22 are equal to each other. The height h12 of the first polar elements 12 and the height h22 of the second polar elements 22 are equal to the sum of the height h14 of the first yoke 14 and the height h24 of the second yoke 24.

The top surface 12a of each first polar element 12 that is the surface of the first polar element 12 on the +Z-axis side, the top surface 22a of each second polar element 22, and the top surface 14a of the first yoke 14 are located within the same plane parallel to the X-Y plane. The top surface 12a of each first polar element 12, the top surface 22a of each second polar element 22, and the top surface 14a of the first yoke 14 together form the end surface of the multipole lens 100 on the +Z-axis side.

The bottom surface 12b of each first polar element 12 which is the surface of the first polar element 12 on the −Z-axis side, the bottom surface 22b of each second polar element 22, and the bottom surface 24a of the second yoke 24 are located within the same plane parallel to the X-Y plane. The bottom surfaces 12b of each first polar element 12, the bottom surface 22b of each second polar element 22, and the bottom surface 24a of the second yoke 24 together form the end surface of the multipole lens 100 on the −Z-axis side.

The first yoke 14 is provided with a through-hole (not shown) and the second yoke 24 is provided with a through-hole (not shown). A pin is inserted in these through-holes to secure the first member 10 and the second member 20 against rotation. The first member 10 and the second member 20 are received in a case (not shown). The first member 10 and the second member 20 are held by injecting a molding agent made from a resin into the case.

As an example, the multipole lens 100 has a diameter of approximately 20 mm and a height of approximately 5 mm.

The first coils 30 which are six in number are mounted on the respective six first polar elements 12. The first polar elements 12 are magnetically excited by feeding electrical current to the first coils 30. The first coils 30 are electrically insulated from the first polar elements 12. For example, the first coils 30 can be electrically insulated from the first polar elements 12 by insulatively coating the surfaces of the first polar elements 12 or attaching insulating tape on the surfaces of the first polar elements 12.

The six second coils 40 are mounted on the respective six second polar elements 22. The second polar elements 22 are magnetically excited by passing electric current through the second coils 40. The second coils 40 are electrically insulated from the second polar elements 22. For instance, the second coils 40 can be electrically insulated from the second polar elements 22 by insulatively coating the surfaces of the second polar elements 22 or attaching insulating tape on the surfaces of the second polar elements 22.

In the multipole lens 100, a desired magnetic field can be produced in spaces surrounded by the polar elements 12 and 22 by passing desired electric currents through the first coils 30 and second coils 40.

2. Method of Fabricating Multipole Lens

Figure 5:
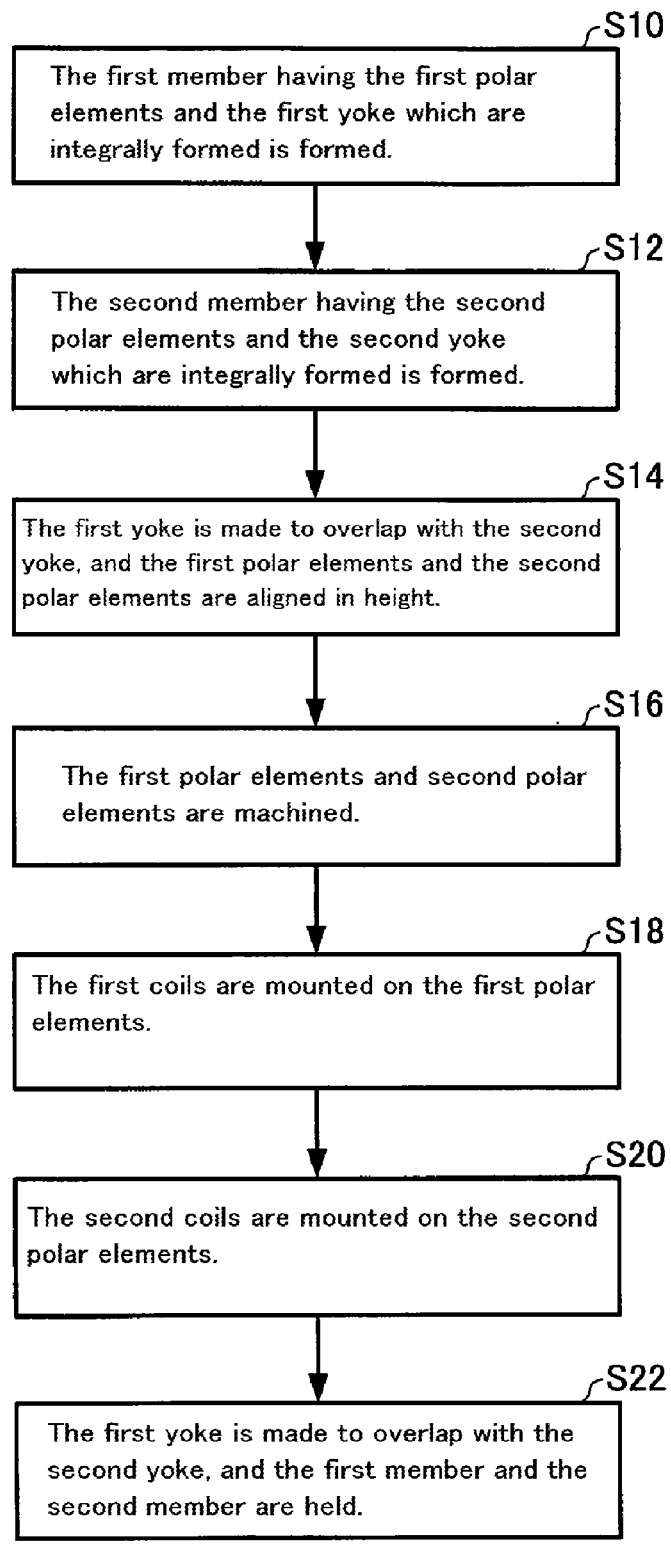
FIG. 5 is a flowchart illustrating one example of manufacturing process associated with another embodiment of the present invention to fabricate a multipole lens.

A method associated with another embodiment of the present invention to fabricate a multipole lens is next described by referring to FIGS. 5 and 6-13. FIG. 5 is a flowchart illustrating one example of the manufacturing process to fabricate the multipole lens. FIGS. 6 to 13 schematically illustrate the steps of the manufacturing process to fabricate the multipole lens 100.

Figure 6:
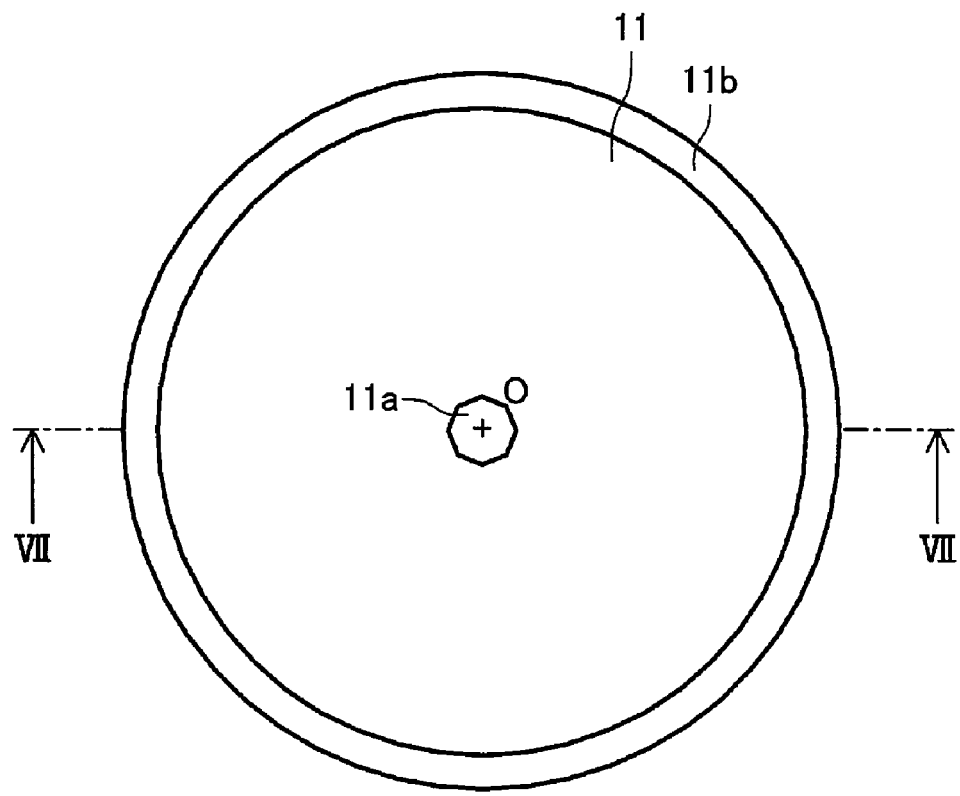
FIGS. 6 to 13 schematically illustrate the steps of the manufacturing process illustrated in FIG. 5.
Figure 7:
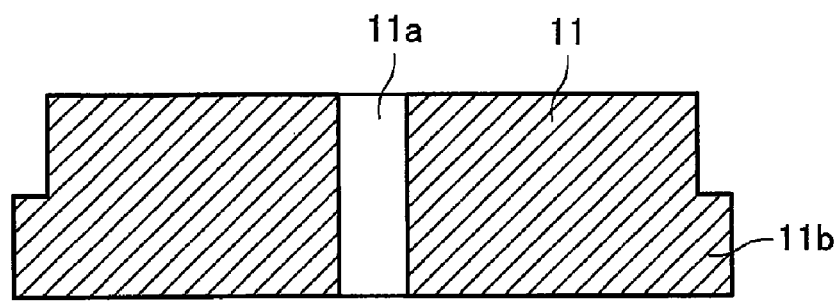
Figure 8:
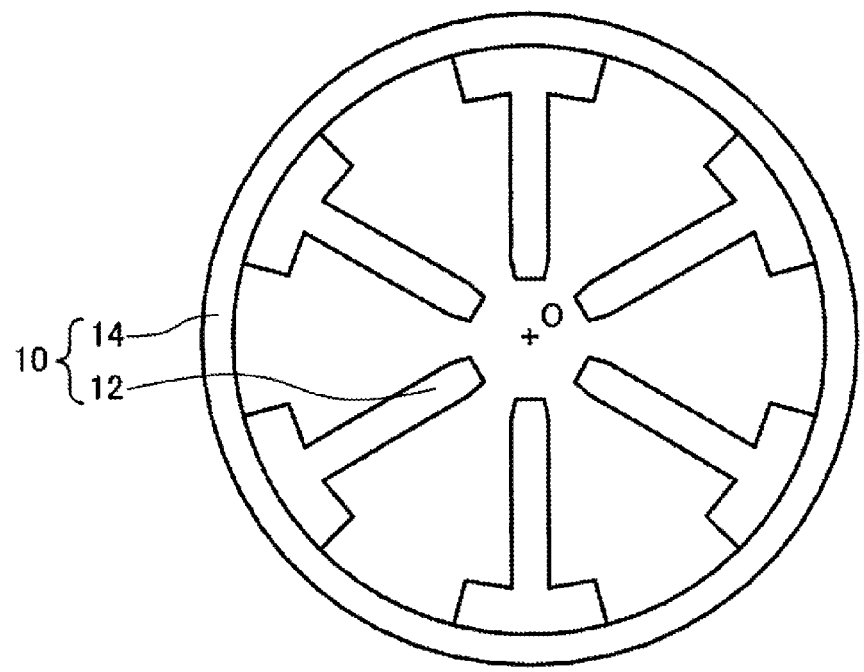

First, the first member 10 having the first polar elements 12 and the first yoke 14 which are integrally formed is formed (step S10). FIG. 6 is a plan view schematically showing a plate-like member 11 from which the first member 10 is made. FIG. 7 is a schematic cross section of the plate-like member 11, taken on line VII-VII of FIG. 6. FIG. 8 is a schematic plan view of the first member 10, and in which a width for finishing is left behind.

In particular, as shown in FIGS. 6 and 7, a hole 11a is formed in the center of the plate-like member 11 that is disklike in shape. A step portion 11b is formed on the side surface of the plate-like member 11. This step portion 11b forms the first yoke 14. The central hole 11a and step portion 11b are formed, for example, using a lathe. Then, as shown in FIG. 8, the first polar elements 12 and first yoke 14 on which finish widths have been left behind are formed, for example, by passing wire (not shown) through the central hole 11a of the plate-like member 11 and processing the plate-like member 11 using wire electric discharge machining. Thus, the first member 10 is formed. In the present manufacturing step, the first yoke 14 is hollow and cylindrically shaped. The 6 first polar elements 12 are formed inside the first yoke 14.

Then, the second member 20 having the second polar elements 22 and the second yoke 24 which are integrally formed is formed (step S12). The second member 20 is fabricated by the same manufacturing step as for the first member 10 (step S10). In the present processing step, the second member 20 is shaped substantially identically to the first member 10. That is, the second yoke 24 is shaped cylindrically. The 6 second polar elements 22 are formed inside the second yoke 24.

Figure 9:
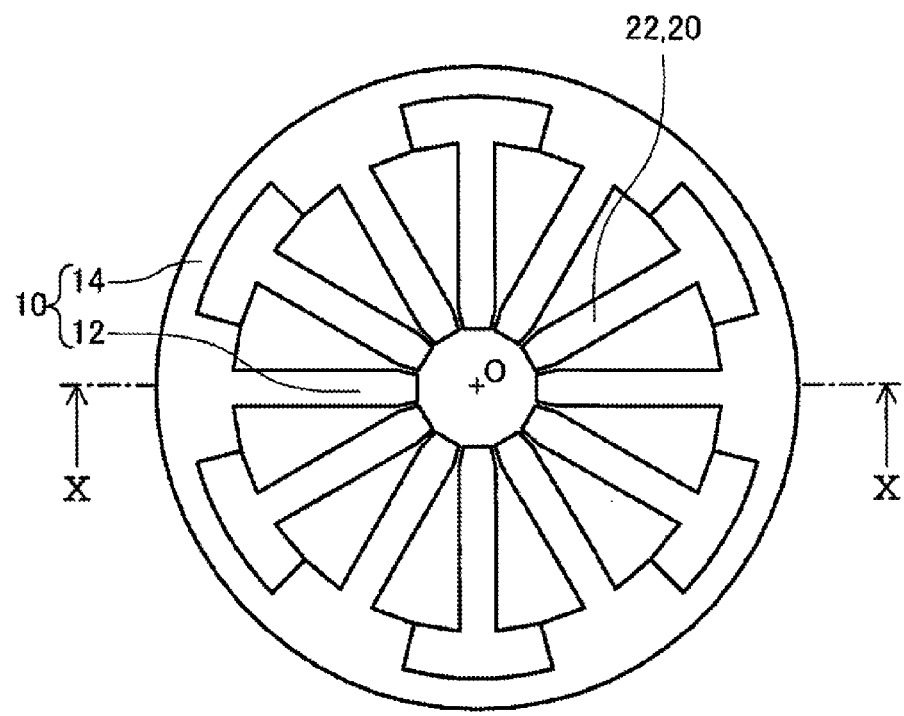
Figure 10:
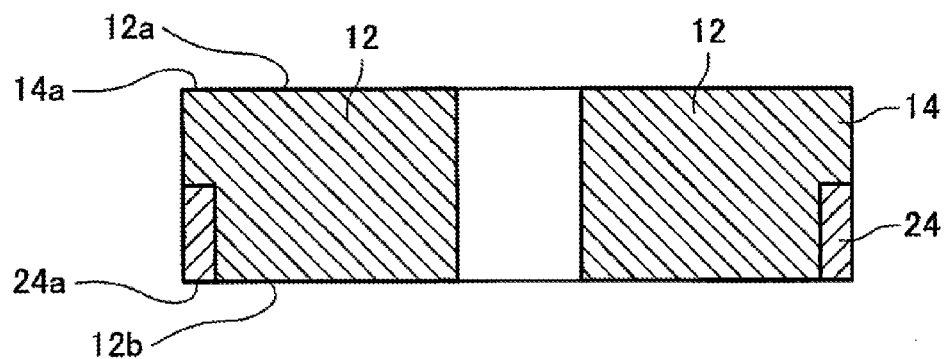

Then, the first yoke 14 of the first member 10 is made to overlap with the second yoke 24 of the second member 20, and the first polar elements 12 and the second polar elements 22 are aligned in height (step S14). FIG. 9 is a plan view schematically showing the state in which the first yoke 14 overlaps with the second yoke 24. FIG. 10 is a cross section taken on line X-X of FIG. 9, schematically showing the state in which the first yoke 14 overlaps with the second yoke 24.

Specifically, as shown in FIGS. 9 and 10, the first yoke 14 is made to overlap with the second yoke 24, and the first member 10 and second member 20 are secured. Then, both end surfaces of this lamination are simultaneously polished to align the first polar elements 12 and second polar elements 22 in height while the first yoke 14 overlaps with the second yoke 24. Also, the both end surfaces are flattened. That is, the top surfaces 12a and bottom surfaces 12b of the first polar elements 12, the top surfaces 22a and bottom surfaces 22b (see FIG. 3) of the second polar elements 22, and the top surface 14a of the first yoke 14, and the bottom surfaces 24a of the second yoke 24 are polished at the same time. Consequently, the first polar elements 12 and second polar elements 22 are made uniform in height. Also, the height of the first polar elements 12 and the height of the second polar elements 22 are set equal to the sum of the height of the first yoke 14 and the height of the second yoke 24.

Figure 11:
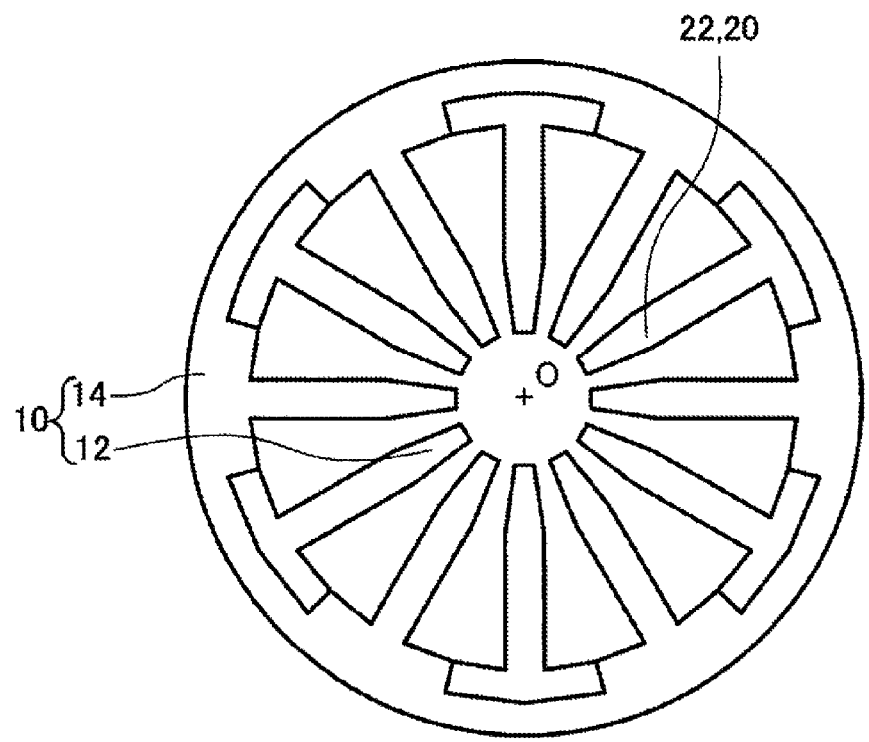

Then, the first yoke 14 is made to overlap with the second yoke 24. The first polar elements 12 and second polar elements 22 are machined (step S16). FIG. 11 is a plan view schematically showing the state in which the first yoke 14 and second yoke 24 are partly on top of each other.

In particular, as shown in FIG. 11, the first polar elements 12 and second polar elements 22 are machined again by wire electric discharge machining to finish them while the first yoke 14 and second yoke 24 are on top of each other. Consequently, the first polar elements 12 and the second polar elements 22 having high positional accuracy are fabricated. Because of the present manufacturing step, the first member 10 and second member 20 are shaped substantially identically to each other.

Figure 12:
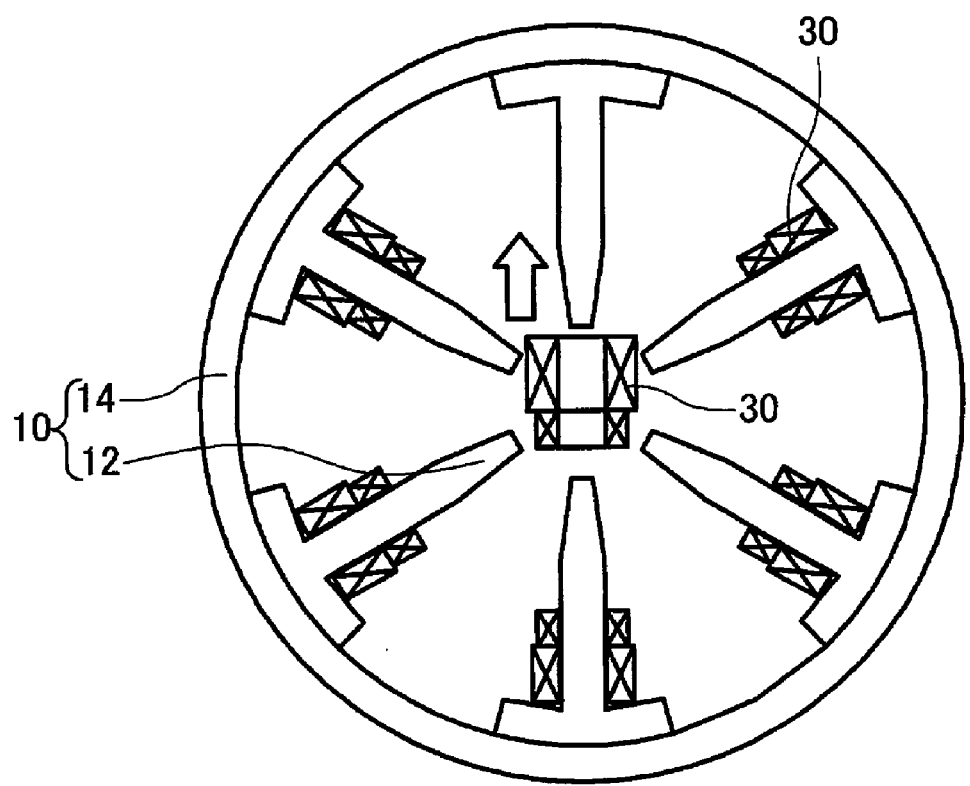

Then, the first coils 30 are mounted on the first polar elements 12 (step S18). FIG. 12 is a plan view schematically showing the manufacturing step for mounting the first coils 30 on the first polar elements 12.

Figure 13:
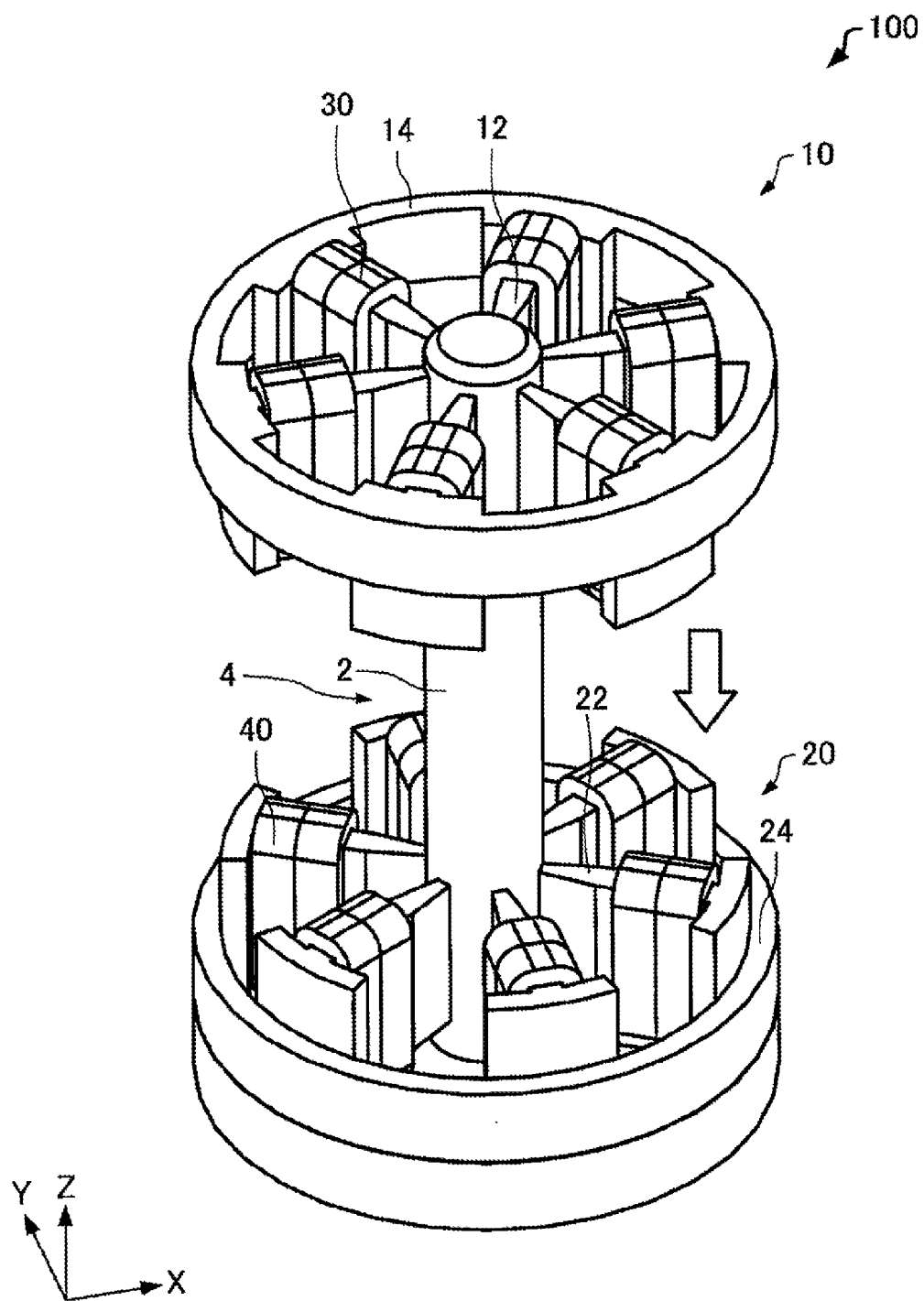

Specifically, as shown in FIG. 13, the first member 10 and second member 20 are spaced apart from each other. The first coils 30 are fitted over the first polar elements 12 from the space in the center of the first member 10 and secured there. At this time, the gaps between the first polar elements 12 and the first coils 30 are electrically insulated, for example, by electrically insulating the surfaces of the first polar elements 12, attaching insulating tape on the surfaces, or using heat shrinkable tubes to prevent electrical shorting to ground.

Then, the second coils 40 are mounted on the second polar elements 22 (step S20) by a process similar to the above-described process of mounting the first coils 30 on the first polar elements 12 (step S18).

The first yoke 14 of the first member 10 is made to overlap with the second yoke 24 of the second member 20, and the first member 10 and the second member 20 are held (step S22). FIG. 13 is a perspective view schematically illustrating the step of placing the first yoke 14 on top of the second yoke 24 using a jig 4.

Specifically, as shown in FIG. 13, the jig 4 having a cylindrical portion 2 is prepared. The second member 20 is inserted over the cylindrical portion 2. Then, the first member 10 is inserted over the cylindrical portion 2. The first yoke 14 is made to overlap with the second yoke 24. At this time, the distances from the front ends of the polar elements 12 and 22 to the position of the center O of the multipole lens can be made equal to each other by aligning the positions of the front ends of the first polar elements 12 and the positions of the front ends of the second polar elements 22 relative to the cylindrical portion 2. That is, the positions of the front ends of the first polar elements 12 and the positions of the front ends of the second polar elements 22 can be aligned with respect to the cylindrical portion 2 of the jig 4.

The first member 10 and second member 20 are held against rotation by the pin passing through the through-holes formed in the first yoke 14 and in the second yoke 24, respectively, in an unillustrated manner.

Alternatively, the first member 10 and the second member 20 may be received in a case, and the first member 10 and the second member 20 may be held by injecting a molding agent made from a resin into the case in an unillustrated manner. Because of the processing steps described so far, the multipole lens 100 can be fabricated.

The method associated with the present embodiment to fabricate a multipole lens has the following features.

The method associated with the present embodiment to fabricate a multipole lens includes the step of forming the first member 10 having the first polar elements 12 and the first yoke 14 formed integrally, the step of forming the second member 20 having the second polar elements 22 and the second yoke 24 formed integrally, and the step of making the first yoke 14 overlap with the second yoke 24 and holding the first member 10 and the second member 20. In this way, in the method associated with the present embodiment to fabricate a multipole lens, the first polar elements 12 and the first yoke 14 are formed integrally and so a parts count reduction can be achieved as compared with the case where polar elements and a yoke are separately formed. Also, the positional accuracy of the first polar elements 12 can be enhanced. Furthermore, the second polar elements 22 and the second yoke 24 are formed integrally. This similarly leads to a parts count reduction. The positional accuracy of the second polar elements 22 can be enhanced. According to the method associated with the present embodiment to fabricate a multipole lens, therefore, the polar elements 12 and 22 can be formed with high accuracy while achieving miniaturization. In addition, the number of components can be reduced. Hence, it is easy to fabricate the multipole lens.

Furthermore, according to the method associated with the present embodiment to fabricate a multipole lens, the spacings between successively adjacent ones of the first polar elements 12 in the first member 10 can be made greater, for example, as compared with the case where all polar elements (e.g., 12 polar elements) are integrally formed in one yoke. Therefore, the multipole lens 100 can be reduced in size. For example, if a multipole lens having one yoke in which all of polar elements (e.g., 12 polar elements) are integrally formed is reduced in size, there arises the problem that it is impossible or difficult to insert coils between successively adjacent ones of the polar elements because the spacings between successively adjacent ones of the polar elements are small. On the other hand, in the method associated with the present embodiment to fabricate a multipole lens, the spacings between successively adjacent ones of the first polar elements 12 can be made large during manufacturing and, therefore, this problem can be circumvented if the multipole lens is reduced in size. Consequently, further miniaturization of the multipole lens can be achieved.

In this way, with this method associated with the present embodiment to fabricate a multipole lens, the spacings between successively adjacent ones of the polar elements 12 and 22 can be made greater during manufacturing as compared with the case where all of polar elements (e.g., 12 polar elements) are integrally formed in one yoke. Therefore, the method associated with the present embodiment to fabricate a multipole lens makes it possible to achieve a multipole lens to which a strong magnetic field can be applied by further reducing the diameters of the front end portions of the polar elements 12 and 22 (i.e., the diameter of a virtual circle interconnecting the front end portions of the polar elements).

With the method associated with the present embodiment to fabricate a multipole lens, the height h12 of the first polar elements 12 and the height h22 of the second polar elements 22 are set equal to the sum of the height h14 of the first yoke 14 and the height h24 of the second yoke 24. Consequently, the both end surfaces of the multipole lens 100 can be flattened.

With the method associated with the present embodiment to fabricate a multipole lens, the top surfaces 12a of the first polar elements 12 and the top surfaces 22a of the second polar elements 22 are located within the same plane, and the bottom surfaces 12b of the first polar elements 12 and the bottom surfaces 22b of the second polar elements 22 are located within the same plane. Therefore, the both end surfaces of the multipole lens 100 can be flattened.

With the method associated with the present embodiment to fabricate a multipole lens, the first yoke 14 is hollow and cylindrically shaped. The first polar elements 12 are formed inside the first yoke 14. The second yoke 24 is hollow and cylindrically shaped. The second polar elements 22 are formed inside the second yoke 24. Therefore, the positional accuracy of the polar elements 12 and 22 can be easily enhanced by assembling the lens based on the outer surfaces of the first yoke 14 and second yoke 24. When the first yoke 14 overlaps with the second yoke 24, the polar elements 12 and 22 are only allowed to rotate. This facilitates placing the polar elements 12 and 22 in position in the direction of rotation with high accuracy.

With the method associated with the present embodiment to fabricate a multipole lens, the formed first polar elements 12 are plural in number. Also, the formed second polar elements 22 are plural in number. Although the plural polar elements are formed by the method associated with the present embodiment to fabricate a multipole lens, the spacings between successively adjacent ones of the polar elements can be made large during manufacturing. Consequently, the lens can be made smaller in size.

With the method associated with the present embodiment to fabricate a multipole lens, the first member 10 and second member 20 are shaped almost identically to each other. As a result, the lens can be manufactured with greater ease.

In the method associated with the present embodiment to fabricate a multipole lens, the step of mounting the first coils 30 on the first polar elements 13 and the step of mounting the second coils 40 on the second polar elements 22 are carried out prior to the step of holding the first member 10 and the second member 20. Therefore, when the first coils 30 are mounted on the first polar elements 12, the spacings between successively adjacent ones of the first polar elements 12 can be made larger than where all polar elements are formed integrally in one yoke. A similar principle applies to the case where the second coils 40 are mounted on the second polar elements 22.

In the method associated with the present embodiment to fabricate a multipole lens, the step of making the first yoke 14 overlap with the second yoke 24 and making uniform the first polar elements 12 and the second polar elements 22 in height is performed prior to the step of holding the first member 10 and the second member 20. Consequently, the first polar elements 12 and the second polar elements 22 can be aligned in height easily and accurately.

In the method associated with the present embodiment to fabricate a multipole lens, the step of making the first yoke 14 overlap with the second yoke 24 and machining the first polar elements 12 and the second polar elements 22 is carried out prior to the step of holding the first member 10 and the second member 20. By making the first yoke 14 overlap with the second yoke 24 and machining the polar elements 12 and 22 while treating the first member 10 and second member 20 as one unitary member in this way, the polar elements 12 and 22 can be formed with high accuracy.

3. Charged Particle Beam System

Figure 14:
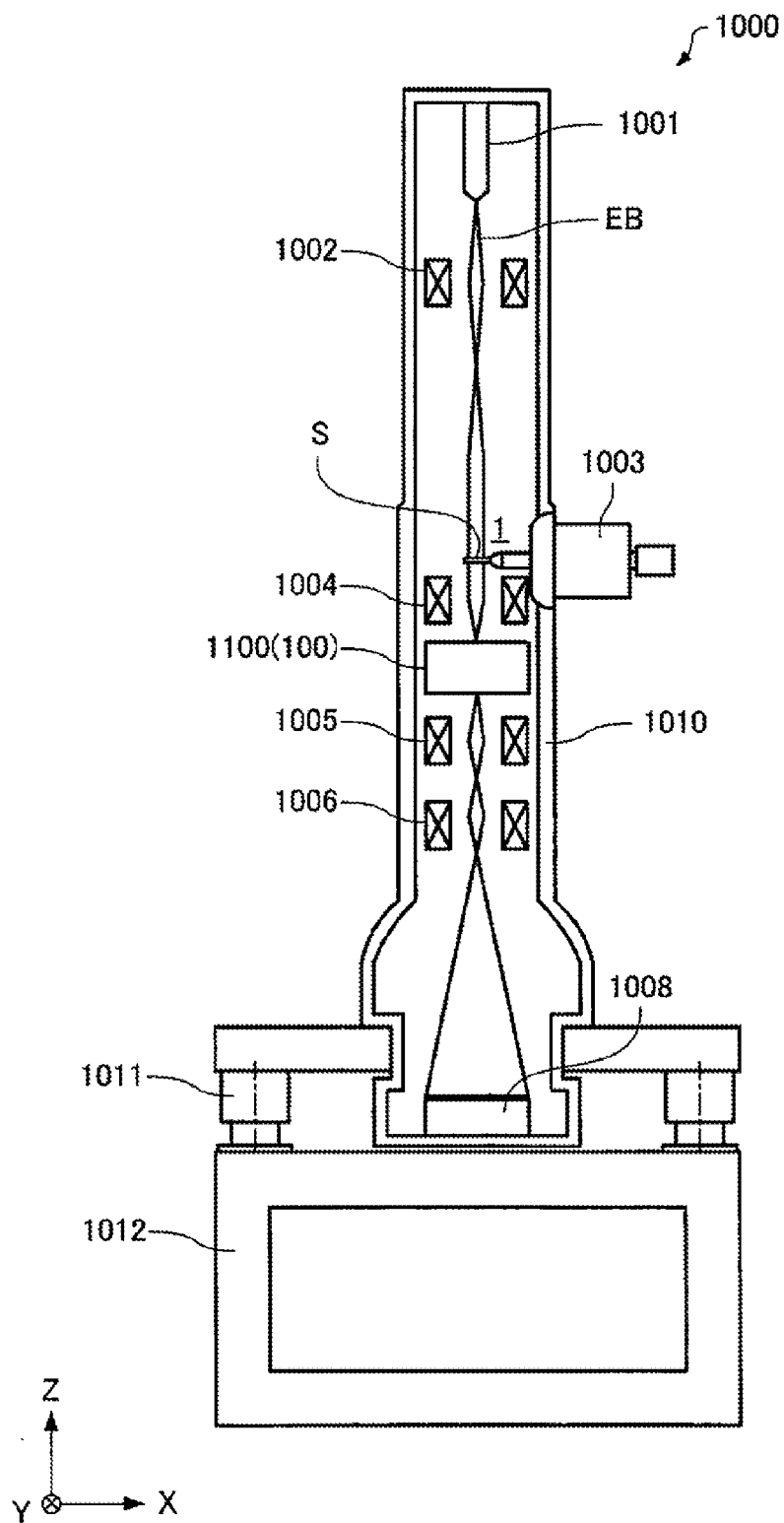
FIG. 14 is a vertical cross section of a charged particle beam system associated with a further embodiment of the present invention.

A charged particle beam system associated with a further embodiment of the present invention is next described by referring to FIG. 14, where the system is generally indicated by reference numeral 1000. In FIG. 14, X-, Y-, and Z-axes are shown as mutually perpendicular axes. It is assumed that the charged particle beam system 1000 is a transmission electron microscope (TEM).

As shown in FIG. 14, the charged particle beam system 1000 is configured including an electron beam source 1001, condenser lenses 1002, a sample stage 1003, an objective lens 1004, an aberration corrector 1100, an intermediate lens 1005, a projector lens 1006, an imager 1008, and an electron optical column 1010.

The charged particle beam source 1001 that is an electron beam source emits an electron beam EB by accelerating electrons by an anode, the electrons being released from a cathode. A well-known electron gun can be used as the electron beam source 1001. No restrictions are placed on the electron gun used as the electron beam source 1001. For example, a thermionic electron gun, a thermal field-emission electron gun, a cold field emission gun, or other electron gun can be used.

The condenser lenses 1002 are disposed behind the electron beam source 1001, and operate to focus the electron beam EB generated by the electron beam source 1001 onto a sample S.

In a sample chamber 1, the sample S is held by a sample holder. The sample chamber 1 is a space inside of the electron optical column 1010. The sample chamber 1 is maintained at vacuum or subatmospheric pressure. In the sample chamber 1, the sample S is irradiated with the charged particle beam, i.e., the electron beam EB.

The sample stage 1003 holds the sample S in the sample chamber 1 and places the sample S in position within the sample chamber 1. In the illustrated example, the sample stage 1003 forms a side-entry stage for inserting the sample holder (and the sample S) from a side of the objective lens 1004.

The objective lens 1004 is disposed behind the condenser lenses 1002. The objective lens 1004 is an initial stage of lens for focusing the electron beam EB transmitted through the sample S.

The objective lens 1004 has an upper polepiece and a lower polepiece (not shown). The objective lens 1004 produces a magnetic field between the upper and lower polepieces to focus the electron beam EB. The upper and lower polepieces are located on opposite sides of the sample S. The sample chamber 1 includes the space lying between the upper and lower polepieces.

The aberration corrector 1100 is located behind the objective lens 1004. The aberration corrector 1100 is configured including a multipole lens 100 associated with the present invention. In the aberration corrector 1100, the multipole lens 100 has a center O (see FIG. 1) that lies in the position of the optical axis of the charged particle beam system 1000. The optical axis of the charged particle beam system 1000 is parallel to the Z-axis. The aberration corrector 1100 corrects aberrations (such as spherical aberration) in the objective lens 1004 by producing a desired magnetic field. Consequently, a high-resolution electron microscope image, for example, can be obtained.

Since the aberration corrector 1100 includes the multipole lens 100 that can be miniaturized, a space saving can be achieved. Also, it is easy to incorporate the aberration corrector 1100 into the charged particle beam system 1000.

The intermediate lens 1005 is disposed behind the objective lens 1004. The projector lens 1006 is disposed behind the intermediate lens 1005. The intermediate lens 1005 and projector lens 1006 cooperate to further magnify the image focused by the objective lens 1004 and to focus the magnified image onto the imager 1008.

The imager 1008 that is a digital camera, for example, captures the image (electron microscope image or electron diffraction pattern) focused by the projector lens 1006. The imager 1008 outputs information about the captured electron microscope image or electron diffraction pattern. The information from the imager 1008 indicative of the electron microscope image or electron diffraction pattern is processed by an image processor (not shown) and displayed on a display device (not shown) which is a CRT, an LCD, a touch panel display, or the like.

In the illustrated example, the charged particle beam system 1000 is mounted on a pedestal 1012 via vibration isolators 1011.

An example has been provided in which a multipole lens associated with the present invention is installed in an aberration corrector for correcting aberrations in the objective lens 1004. A multipole lens associated with the present invention may be installed in an aberration corrector for correcting aberrations in other lens (such as the condenser lenses 1002).

In the description provided so far, the multipole lens associated with the present invention is applied to a transmission electron microscope. The invention is not restricted to this example of application. The multipole lens may also be applied to other charged particle beam system. Examples of such charged particle beam system include a scanning electron microscope (SEM), a scanning transmission electron microscope (STEM), a focused ion beam (FIB) system, and an electron beam exposure system.

It is to be understood that the present invention is not restricted to the foregoing embodiments but can be implemented in various forms within the scope and ambit of the present invention.

For example, in the foregoing embodiments, the multipole lens has 12 poles. No restriction is imposed on the number of the polar elements of the multipole lens associated with the present invention as long as the number is two or more. For instance, the multipole lens associated with the present invention may have 6 poles or 8 poles.

Furthermore, in the above embodiments, the multipole lens 100 has two members, i.e., the first member 10 and the second member 20. The multipole lens associated with the present invention may have three or more members each of which has a yoke formed integrally with polar elements.

For example, in the above embodiments, the first member 10 has the 6 polar elements 12 and the second member 20 has the 6 polar elements 22, thus providing 12 polar elements. Alternatively, each of three members may have 4 polar elements. Each of four members may have 3 polar elements. Each of 6 members may have 2 polar elements. Each of 12 members may have a single polar element. By increasing the number of members in this way, the spacings between successively adjacent ones of the polar elements in each member can be increased further during manufacturing. Where the multipole lens has n members (where n is an integer equal to or greater than 2), n yokes are placed on top of each other and so the height of each polar element is equal to the sum of the heights of the n yokes.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

The invention claimed is:

1. A method of fabricating a multipole lens, comprising the steps of:
    forming a first member having a first yoke formed integrally with at least one first polar element;
    forming a second member having a second yoke formed integrally with at least one second polar element; and
    making the first yoke overlap with the second yoke and holding the first member and the second member,
    wherein said first yoke and said second yoke are hollow and cylindrically shaped, and wherein said first polar element and said second polar element are located inside said first yoke and said second yoke, respectively, and wherein the first polar element and the second polar element are alternately arranged along a virtual circle centered at the center of the multipole lens when the first and second members are held together.

2. The method of fabricating a multipole lens as set forth in claim 1, wherein said first polar element and said second polar element are equal in height, and wherein the height of each of the first and second polar elements is set equal to a sum of a height of said first yoke and a height of said second yoke.

3. The method of fabricating a multipole lens as set forth in claim 1, wherein said first polar element and said second polar element have their respective top surfaces located within the same plane, and wherein the first polar element and the second polar element have their respective bottom surfaces located within the same plane.

4. The method of fabricating a multipole lens as set forth in claim 1, wherein said at least one first polar element is plural in number, and wherein said at least one second polar element is plural in number.

5. The method of fabricating a multipole lens as set forth in claim 1, wherein said first member and said second member are shaped substantially identically to each other.

6. The method of fabricating a multipole lens as set forth in claim 1, further comprising the steps of:
    mounting at least one first coil on said at least one first polar element prior to the step of holding said first member and said second member; and
    mounting at least one second coil on said at least one second polar element prior to the step of holding said first member and said second member.

7. The method of fabricating a multipole lens as set forth in claim 1, further comprising the step of making said first yoke overlap with said second yoke and making said first polar element and said second polar element uniform in height prior to the step of holding said first member and said second member.

8. The method of fabricating a multipole lens as set forth in claim 1, further comprising the step of making said first yoke overlap with said second yoke and machining said first polar element and said second polar element prior to the step of holding said first member and said second member.

9. A multipole lens comprising:
    a first member having a first yoke formed integrally with at least one first polar element; and
    a second member having a second yoke formed integrally with at least one second polar element;
    wherein said first yoke overlaps with said second yoke, and
    wherein said first yoke and said second yoke are hollow and cylindrically shaped, and wherein said first polar element and said second polar element are located inside said first yoke and said second yoke, respectively, and wherein the first polar element and the second polar element are alternately arranged along a virtual circle centered at the center of the multipole lens when the first and second members are held together.

10. The multipole lens as set forth in claim 9, wherein said first polar element and said second polar element are equal in height, and wherein the height of each of the first and second polar elements is set equal to a sum of a height of said first yoke and a height of said second yoke.

11. The multipole lens as set forth in claim 9, wherein said first polar element and said second polar element have their respective top surfaces located within the same plane, and wherein said first polar element and said second polar element have their respective bottom surfaces located within the same plane.

12. The multipole lens as set forth in claim 9, wherein said at least one first polar element is plural in number, and wherein said at least one second polar element is plural in number.

13. A charged particle beam system including a multipole lens as set forth in claim 9.

\* \* \* \* \*